(12) United States Patent
Tanaka et al.

(10) Patent No.: US 9,941,127 B2
(45) Date of Patent: Apr. 10, 2018

(54) SEMICONDUCTOR DEVICE AND METHOD OF MANUFACTURING SEMICONDUCTOR DEVICE

(71) Applicant: Kabushiki Kaisha Toshiba, Minato-ku, Tokyo (JP)

(72) Inventors: Bungo Tanaka, Nonoichi Ishikawa (JP); Norio Yasuhara, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/231,966

(22) Filed: Aug. 9, 2016

(65) Prior Publication Data

US 2017/0047444 A1    Feb. 16, 2017

(30) Foreign Application Priority Data

Aug. 12, 2015 (JP) .................................. 2015-159647

(51) Int. Cl.
*H01L 27/148* (2006.01)
*H01L 29/80* (2006.01)
(Continued)

(52) U.S. Cl.
CPC .. *H01L 21/28035* (2013.01); *H01L 29/42376* (2013.01); *H01L 29/4916* (2013.01);
(Continued)

(58) Field of Classification Search
CPC .......... H01L 29/4236; H01L 29/42372; H01L 29/7397; H01L 29/7813; H01L 29/66666;
(Continued)

(56) References Cited

U.S. PATENT DOCUMENTS 8,125,025 B2 * 2/2012 Yoshimochi ........ H01L 29/4941
257/302
8,723,254 B2 * 5/2014 Hikichi ................. H01L 29/456
257/331
(Continued)

FOREIGN PATENT DOCUMENTS

JP    2004-095745 A    3/2004
JP    2006-190947 A    7/2006

*Primary Examiner* — Hsien Ming Lee
(74) *Attorney, Agent, or Firm* — White & Case LLP

(57) ABSTRACT

A semiconductor includes a first electrode, a first semiconductor region, a second semiconductor region, a third semiconductor region, and a gate electrode. The gate electrode has a first portion arranged with the second semiconductor region in a direction perpendicular to a first direction extending from the first electrode to the first semiconductor region, and has a second portion on the first portion. The semiconductor also includes a gate insulating layer between the gate electrode and each of the three semiconductor regions. The gate insulating layer extends to the upper surface of the third semiconductor region to form an extending portion. The second portion of the gate electrode protrudes in an upward direction from the upper surface of the extending portion of the gate insulating layer, and a lower part of the second portion of the gate electrode is embedded in the first portion of the gate electrode.

13 Claims, 5 Drawing Sheets

(51) Int. Cl.
*H01L 29/76* (2006.01)
*H01L 21/28* (2006.01)
*H01L 29/49* (2006.01)
*H01L 29/66* (2006.01)
*H01L 29/78* (2006.01)
H01L 29/423 (2006.01)
H01L 29/417 (2006.01)
H01L 29/739 (2006.01)

(52) U.S. Cl.
CPC .... *H01L 29/66734* (2013.01); *H01L 29/7813* (2013.01); *H01L 29/41775* (2013.01); *H01L 29/4236* (2013.01); *H01L 29/7397* (2013.01)

(58) Field of Classification Search
CPC .......... H01L 29/66909; H01L 29/7828; H01L 29/7788; H01L 29/7827; H01L 29/78642; H01L 29/7926; H01L 21/823431; H01L 21/823487; H01L 21/823821; H01L 21/823885; H01L 27/0886; H01L 27/0924; H01L 27/10841
USPC .......................... 257/220, 263, 328, 330, 331
See application file for complete search history.

(56) References Cited

U.S. PATENT DOCUMENTS

2006/0134858 A1  6/2006  Yamazaki
2006/0138474 A1  6/2006  Yu et al.

\* cited by examiner

US 9,941,127 B2

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2015-159647 filed on Aug. 12, 2015, the entire contents of which are incorporated herein by reference.

FIELD

Embodiments of the present invention relate to a semiconductor device and a method of manufacturing a semiconductor device.

BACKGROUND

A semiconductor device such as an MOSFET (Metal Oxide Semiconductor Field Effect Transistor) and an IGBT (Insulated Gate Bipolar Transistor) attains the ON state when a voltage equal to or more than a threshold value is applied to a gate electrode thereof.

A period of time from when a voltage is started to be applied to the gate electrode to when the voltage of the gate electrode becomes equal to or more than a threshold value is proportional to the electrical resistance of the gate electrode. Therefore, in order to operate the semiconductor device at a high speed, the electrical resistance of the gate electrode is preferably smaller.

BRIEF DESCRIPTION OF THE DRAWINGS

FIG. 2 B is a cross sectional view illustrating a production step for producing the semiconductor device according to the first embodiment.

FIG. 3 B is a cross sectional view illustrating a production step for producing the semiconductor device according to the first embodiment.

FIG. 4 B is a cross sectional view illustrating a production step for producing the semiconductor device according to the first embodiment.

DETAILED DESCRIPTION

Figure 1:
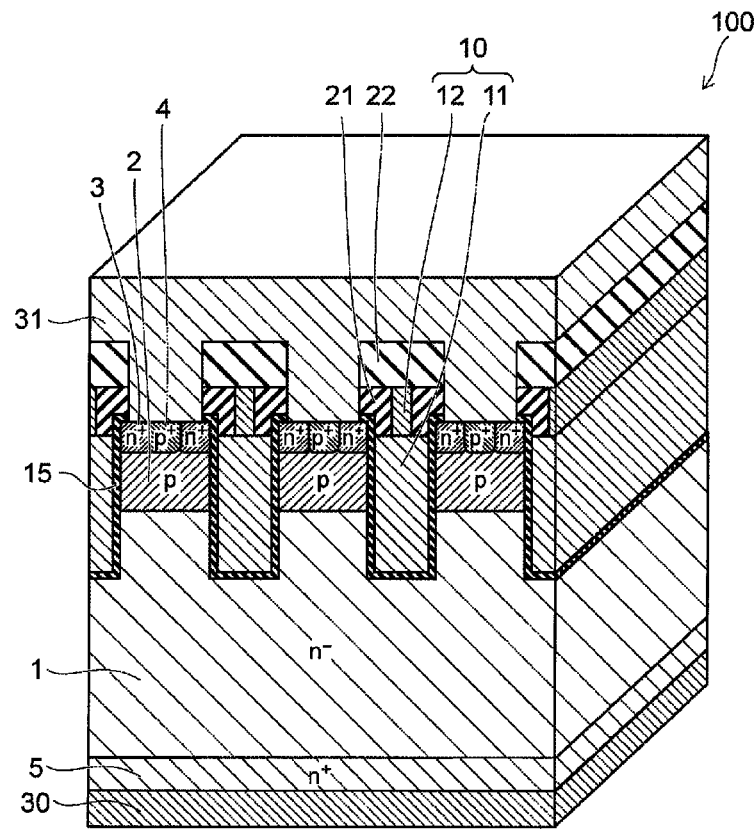
FIG. 1 is a cross sectional perspective view illustrating a portion of a semiconductor device according to a first embodiment.

Each of the embodiments of the present invention will be hereinafter described with reference to drawings.

It should be noted that the drawings are illustrated schematically or conceptually, and the relationship between the thickness and the width of each portion and the ratio of the sizes of the portions are not necessarily the same as the actual relationship and ratio. Even when the same portion is indicated, the dimensions and the ratios may be shown differently from each other depending on the drawings.

In the specification of the present application and each drawing, the same elements as those already explained are denoted with the same reference numerals, and detailed explanation thereabout is omitted as necessary.

In the explanation about each embodiment, XYZ Cartesian coordinate system is used. A direction extending from the drain electrode 30 to the n− type semiconductor area 1 is denoted as a Z direction (first direction), and two directions perpendicular to the Z direction and perpendicular to each other are denoted as an X direction (second direction) and a Y direction (third direction).

In the following explanation, descriptions of n+, n− and p+, p indicate relative levels of impurity concentration in each conductivity type. More specifically, the description attached with "+" has a relatively higher impurity concentration than the description having neither "+" nor "−" attached thereto. The description attached with "−" has a relatively lower impurity concentration than the description having neither "+" nor "−" attached thereto.

In each embodiment explained below, each embodiment may be carried out by replacing the p type and the n type with each other in each semiconductor region.

(First Embodiment)

An example of a semiconductor device according to the first embodiment will be explained with reference to FIG. 1.

FIG. 1 is a cross sectional perspective view illustrating a portion of the semiconductor device 100 according to the first embodiment.

As shown in FIG. 1, the semiconductor device 100 includes an n+ type (first conductivity type) drain region 5, an n− type semiconductor region 1 (first semiconductor region) a p type (second conductivity type) base region 2 (second semiconductor region), an n+ type source region 3 (third semiconductor region), a p+ type contact region 4, a gate electrode 10, a gate insulating layer 15, a first insulating portion 21, a second insulating portion 22, a drain electrode 30 (first electrode), and a source electrode 31 (second electrode).

A drain electrode 30 is provided on the lower surface of the semiconductor device 100.

The n+ type drain region 5 is provided on the drain electrode 30 and is electrically connected to the drain electrode 30.

The n− type semiconductor region 1 is provided on the n+ type drain region 5.

The p type base region 2 is provided on the n− type semiconductor region 1.

The n+ type source region 3 and the p+ type contact region 4 are selectively provided on the p type base region 2.

A plurality of p type base regions 2, n+ type source regions 3, and p+ type contact. regions 4 are provided in the X direction, and each of the p type base regions 2, n+ type source regions 3, and p+ type contact regions 4 extends in the Y direction, respectively.

Alternatively, the n+ type source region 3 and the p+ type contact region 4 may be provided alternately in the Y direction on each of the p type base regions 2.

The gate electrode 10 includes a first portion 11 and a second portion 12.

The first portion 11 is lined in the X direction with the n− type semiconductor region 1, the p type base region 2, and the n+ type source region 3. The gate insulating layer 15 is provided between these semiconductor regions and the first portion 11.

The second portion 12 is provided on a part of the first portion 11.

The first insulating portion 21 is provided on another portion of the first portion. 11, and the second portion 12 is surrounded. by the first insulating portion 21 on the X-Y plane The second insulating portion 22 is provided on the first insulating portion 21.

In the example as shown in FIG. 1, the lower end of the second portion 12 is in contact with the upper surface of the first portion 11. The upper surface of the first portion 11 and the lower end of the second portion 12 are lined in the X direction with the n+ type source region 3 and the p+ type contact region 4. The length of the second portion 12 in the X direction is shorter than the length of the first portion 11 in the X direction.

The gate electrodes 10, first insulating portions 21, and second insulating portions 22 are arranged in the X direction, and each of the gate electrodes 10, first insulating portions 21, and second insulating portions 22 extends in the Y direction, respectively.

The source electrode 31 is provided on the upper surface of the semiconductor device 100 and on the n+ type source region 3, the p+ type contact region 4, and the second insulating portion 22. The source electrode 31 is electrically connected to the n+ type source region 3 and the p+ type contact region 4.

At least a portion of the second portion 12 is lined in the X direction with the source electrode 31. The source electrode 31 and the gate electrode 10 are electrically isolated by the first insulating portion 21 and the second insulating portion 22.

In this case, an example of material of each constituent element will be explained.

The n+ type drain region 5, the n− type semiconductor region 1, the p type base region 2, the n+ type source region 3, and the p+ type contact region 4 include silicon, silicon carbide, gallium nitride, or gallium arsenide as semiconductor materials.

The n type impurities that are added to the semiconductor material can include arsenic, phosphorus, or antimony. Boron can be used as the p type impurity.

The first portion 11 of the gate electrode 10 includes polycrystalline silicon.

The second. portion 12 of the gate electrode 10 includes metal. The second portion 12 includes, as metal, at least any one of, for example, aluminum, titanium, nickel, tungsten, copper, and gold. The second portion 12 may further include a metallic compound such as titanium nitride.

The gate insulating layer 15, the first insulating portion. 21, and the second insulating portion 22 include insulating materials such as silicon oxide.

The drain electrode 30 and the source electrode 31 include metal such as aluminum.

Subsequently, an example of a production method for producing the semiconductor device according to the first embodiment will be explained with reference to FIG. 2 to FIG. 4.

Figure 2A:
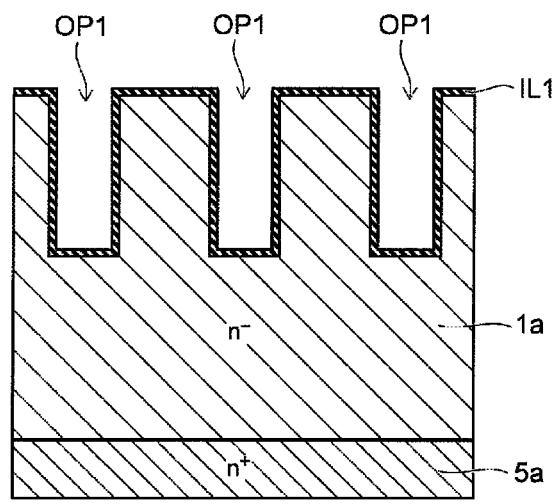
FIG. 2 A is a cross sectional view illustrating a production step for producing the semiconductor device according to the first embodiment.
Figure 2B:
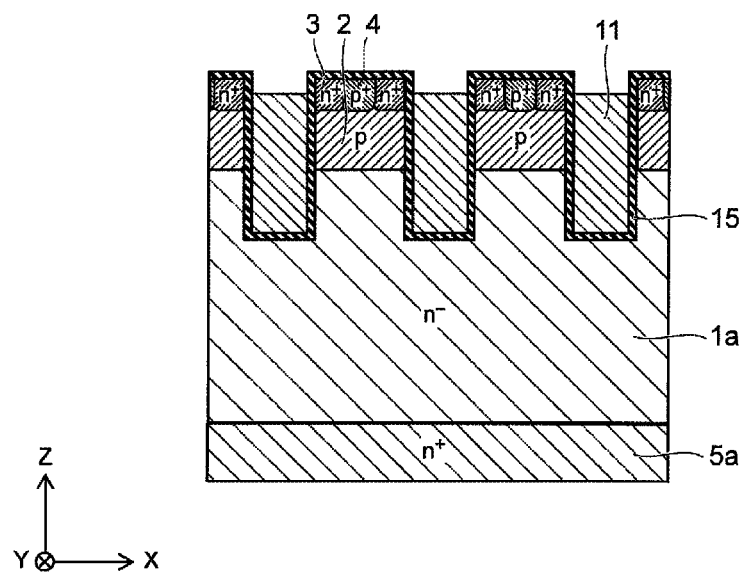
Figure 3A:
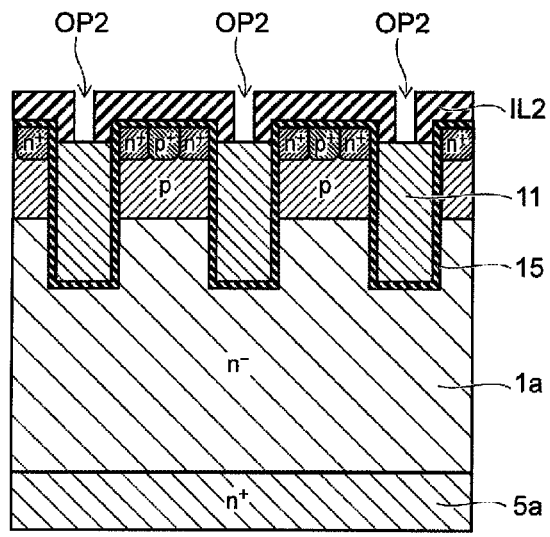
FIG. 3 A is a cross sectional view illustrating a production step for producing the semiconductor device according to the first embodiment.
Figure 3B:
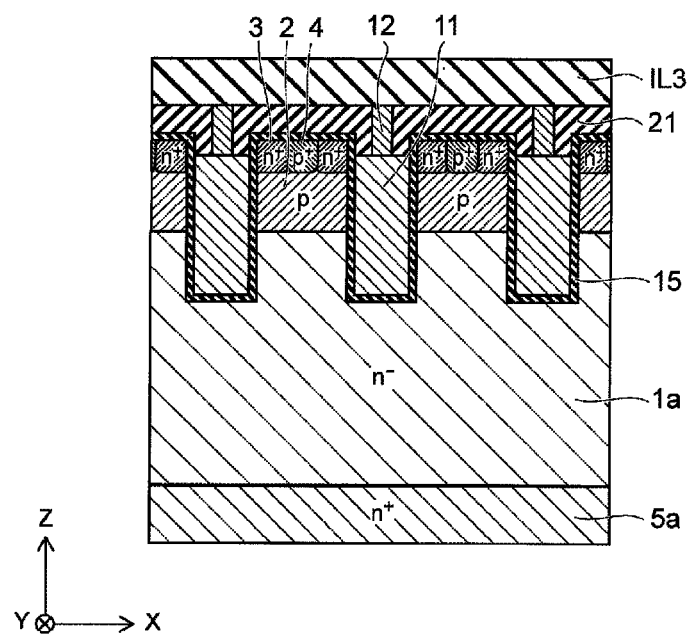
Figure 4A:
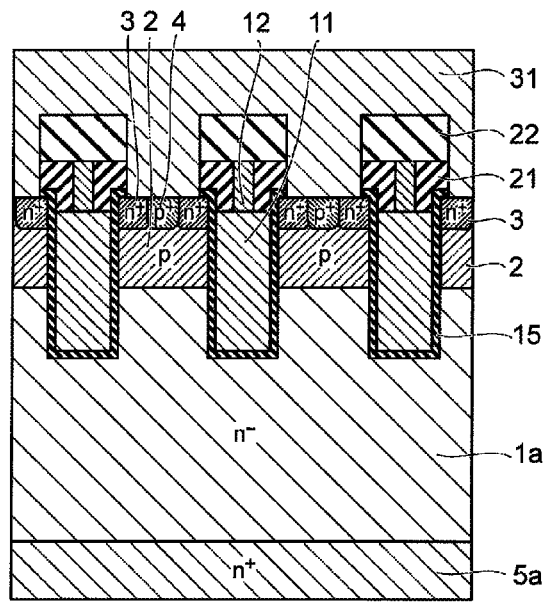
FIG. 4 A is a cross sectional view illustrating a production step for producing the semiconductor device according to the first embodiment.
Figure 4B:
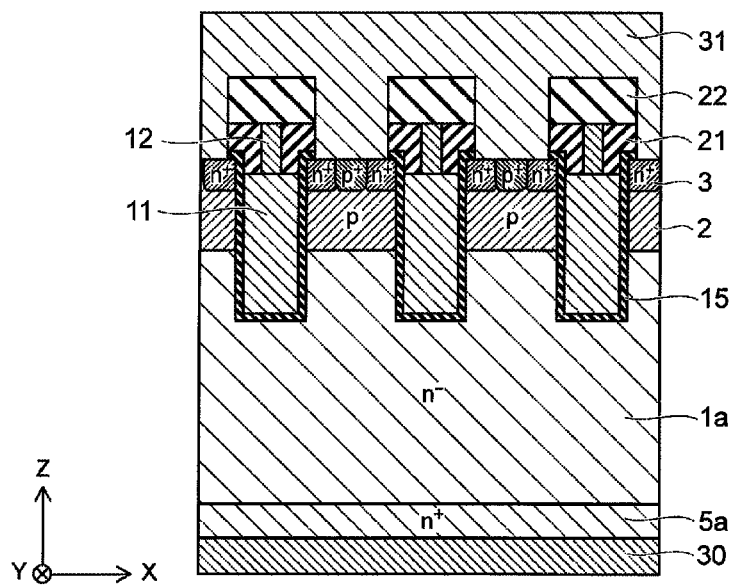

FIG. 2 to FIG. 4 are cross sectional views illustrating production steps of the semiconductor device 100 according to the first embodiment.

First, a semiconductor substrate including an n+ type semiconductor layer 5a and an n− type semiconductor layer 1a provided on the n+ type semiconductor layer 5a is prepared. Subsequently, openings OP1 are formed on the surface of the n− type semiconductor layer 1a. Subsequently, by applying thermal oxidation, as shown in FIG. 2 A, an insulating layer IL1 is formed on the inner wall of the opening OP1 and the upper surface of the n− type semiconductor layer 1a.

Subsequently, the ions of the p type impurity and the n type impurity are injected in order into the n− type semiconductor layer 1a between the openings OP1, and thermal treatment is applied, so that the impurity is activated. With these steps, as shown in FIG. 2 B, the p type base region 2, the n+ type source region 3, and the p+ type contact region 4 are formed.

Subsequently, a conductive layer including polycrystalline silicon is formed on the insulating layer IL1. Subsequently, a portion of this conductive layer is etched to reduce the upper surface, so that the first portion 11 is formed. in the inside of each of the openings OP1. Subsequently, an insulating layer IL2 covering the first portion 11 is formed. As shown in FIG. 3 A, openings OP2 are formed in the insulating layer IL2. The opening OP2 is formed so that a portion of the upper surface of the first portion 11 is exposed through the opening OP2. The opening OP2 is formed so that the width of the opening OP2 (the dimension in. the X direction) is narrower than the width of the opening OP1.

Subsequently, a metal layer embedding the openings OP2 is formed on the insulating layer IL2. Subsequently, this metal layer is polished, and the portion provided other than the inside of the opening OP2 is removed, so that the second portion 12 surrounded by the insulating layer IL2 is formed. With this step, the gate electrode 10 having the first portion 11 and the second portion 12 represented in FIG. 1 is formed. Subsequently, as shown in FIG. 3 B, the insulating layer IL3 covering the second portion 12 is formed on the insulating layer 112.

Subsequently, a portion of each of the insulating layers IL1 to IL3 is removed, so that the n+ type source region 3 and the p+ type contact region 4 are exposed. With this step, the insulating layers IL1 to IL3 are divided in the X direction, and first insulating portions 21 and second insulating portions 22 as shown in FIG. 1 are formed. Subsequently, a metal layer covering the second insulating portion 22 is formed on the n+ type source region 3 and the p+ type contact region 4. By patterning this metal layer, the source electrode 31 is formed. as shown in FIG. 4 A.

Subsequently, the back surface of the n+ type semiconductor layer 5a is polished until the n+ type semiconductor layer 5a attains a predetermined thickness. Subsequently, as shown in FIG. 4 B, the drain electrode 30 is formed on the back surface of the polished n+type semiconductor layer 5a, so that the semiconductor device 100 as shown in Fig 1 is obtained.

The actions and effects with the present embodiment will be explained.

In the semiconductor device according to the present embodiment, the gate electrode 10 includes the first portion 11 and the second portion 12. The electrical resistance of the second portion 12 including metal is less than the electrical resistance of the first portion including polycrystalline silicon. Therefore, since the second portion 12 is provided, the electrical resistance of the gate electrode can be reduced.

Further, according to the present embodiment, the second portion 12 is provided on a part of the first portion 11, the first insulating portion 21 is provided on another part of the first portion 11, and the second portion 12 is surrounded by the first insulating portion 21. By employing such configuration, the distance between the second portion 12 and the source electrode 31 in the X direction can be increased, and the increase in the capacitance between the gate electrode 10 and the source electrode 31 can be suppressed.

More specifically, according to the present embodiment, while the electrical resistance of the gate electrode 10 is reduced, the increase in the capacitance between the gate electrode 10 and the source electrode 31 can be suppressed.

The second portion 12 is provided only on a part of the first portion 11, and therefore, when the first insulating portion 21 and the second insulating portion 22 are formed by patterning the insulating layer, this can reduce the possibility of exposing the second portion 12 by mistake because of variation in the patterning positions.

More specifically, according to the semiconductor device according to the present embodiment, the yield of the semiconductor device can be improved.

The first insulating portion 21 and the second insulating portion 22 are provided so that a part of the first insulating portion 21 and a part of the second insulating portion 22 are located above the n+ type source region 3, so that this can further reduce the possibility of exposing the second. portion 12 by mistake because of variation in the patterning positions (Second Embodiment)

An example of a semiconductor device according to the second embodiment will be explained with reference to FIG. 5

Figure 5:
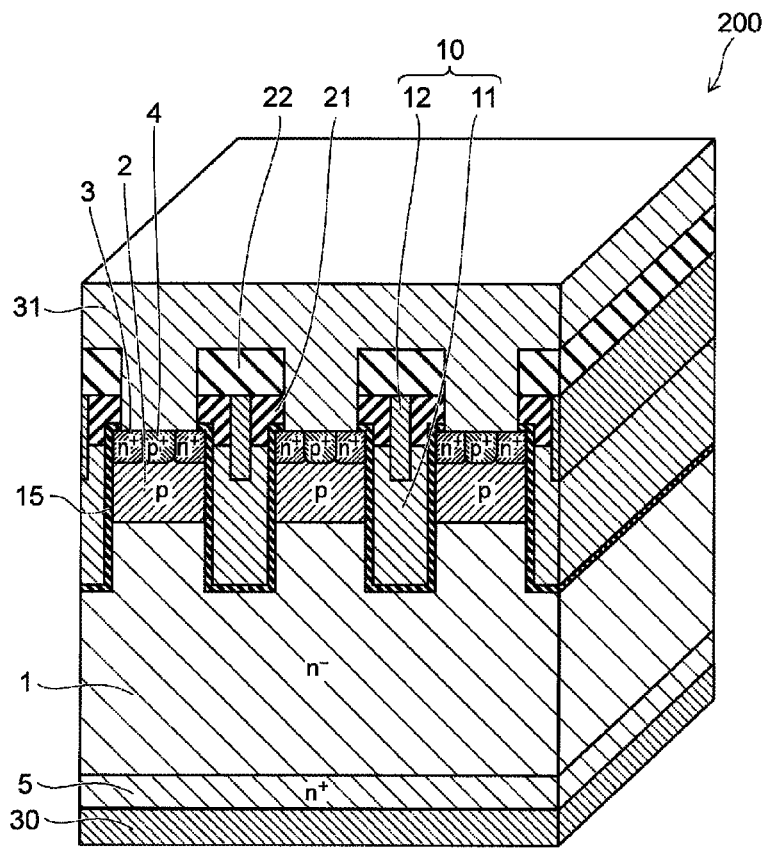
FIG. 5 is a cross sectional perspective view illustrating a portion of a semiconductor device according to a second embodiment.

FIG. 5 is a cross sectional perspective view illustrating a portion of the semiconductor device 200 according to the second embodiment.

When the semiconductor device 200 is compared with the semiconductor device 100, for example, the semiconductor device 200 has a difference in the structure of the second portion 12.

In the semiconductor device 200, the second portion 12 is provided on a part of the first portion 11, and is surrounded by another part of the first portion 11 outside a groove on the X-Y plane.

In the example as shown in FIG. 5, the lower end of the second portion 12 is lined in the X direction with the p type base region 2, but the lower end of the second portion 12 may be lined in the X direction with the n+ type source region 3 or the n− type semiconductor area 1. As the position of the lower end of the second portion 12 becomes deeper, the volume of the second portion 12 can be increased.

According to the present embodiment, the volume of the second portion 12 is larger than that of the first embodiment. Therefore, the electrical resistance of the gate electrode 10 can be further reduced.

In the explanation about each embodiment described above, an example where the invention according to each embodiment is applied to the MOSFET has been explained. However, the invention according to each embodiment is not limited to the MOSFET, and, for example, the invention according to each embodiment may be applied to IGBT. In this case, for example, p+ type semiconductor region is provided between the n+ type drain area 5 and the drain electrode 30.

In each embodiment explained above, relative levels of the impurity concentrations between the semiconductor regions may be found by using, for example, a SCM (scanning capacitance microscope). It should be noted that the carrier concentration in each semiconductor region may be deemed as being the same as the activated impurity concentration in each semiconductor region. Therefore, relative levels of the carrier concentrations between the semiconductor regions can also be found by using the SCM.

The impurity concentrations of each semiconductor region can be measured with, for example, SIMS (secondary ion Mass spectrometry).

The materials included in each portion of the gate electrode 10 can be found by using, for example, SIMS (secondary ion mass spectrometry) GD-OES (glow discharge optical emission spectrometry), XPS (X-ray photoelectron spectroscopy), and the like.

Specific configuration of each element such as, for example, the n+ type drain region 5, the n− type semiconductor region 1, the p type base region 2, the n+ type source region 3, the p+ type contact region 4, the gate insulating layer 15, the drain electrode 30, the source electrode 31, and the like included in the embodiment can be selected as necessary from the publicly known art by a person skilled in the art.

The embodiments explained above can be combined with each other to be carried out.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a first semiconductor region of a first conductivity type provided on the first electrode;
a second semiconductor region of a second conductivity type provided on the first semiconductor region;
a third semiconductor region of the first conductivity type selectively provided on the second semiconductor region;
a gate electrode including:
   a first portion including polycrystalline silicon and arranged with the second semiconductor region in a second direction perpendicular to a first direction extending from the first electrode to the first semiconductor region and
   a second portion including metal and provided on a part of the first portion;
a gate insulating layer provided between the gate electrode and each of the first semiconductor region, the second semiconductor region, and the third semiconductor region, the gate insulating layer extends to the upper surface of the third semiconductor region to form an extending portion;
a first insulating portion provided on another part of the first portion and being adjacent to the second portion in the second direction;
a second insulating portion provided on the second portion and on the first insulating portion; and
a second electrode provided on the third semiconductor region and on the second insulating portion, and arranged with the second portion in the second direction, wherein
the second portion of the gate electrode protrudes upwardly from the upper surface of the extending portion of the gate insulating layer, and a lower part of the second portion of the gate electrode is embedded in the polycrystalline silicon of the first portion of the gate electrode.

2. The semiconductor device according to claim 1, wherein the second portion is surrounded by the another part of the first portion outside a groove.

3. The semiconductor device according to claim 1, wherein a length of the second portion in the first direction is shorter than a length of the first portion in the first direction.

4. The semiconductor device according to claim 1, wherein one end of the second portion in the first direction is aligned with the third semiconductor region along a line in the second direction from the one end of the second portion.

5. The semiconductor device according to claim 1, wherein a part of the first insulating portion and a part of the second insulating portion are provided on the third semiconductor region.

6. The semiconductor device according to claim 1, wherein the second semiconductor region, the third semiconductor region, and the gate electrode extend in a third direction perpendicular to the first direction and the second direction.

7. The semiconductor device according to claim 1, wherein the second portion is in contact with the first portion.

8. The semiconductor device according to claim 1, wherein one end of the second portion in the first direction is aligned with any of the first semiconductor region and the second semiconductor region along a line in the second direction from the one end of the second portion.

9. The semiconductor device according to claim 1, further comprising:
a fourth semiconductor region of the second conductivity type selectively provided on the second semiconductor region,
wherein a carrier concentration of the second conductivity type in the fourth semiconductor region is higher than a carrier concentration of the second conductivity type in the second semiconductor region.

10. The semiconductor device according to claim 1, wherein a lower part of the second portion in the first direction is aligned with the fourth semiconductor region along a line in the second direction from the one end of the second portion.

11. The semiconductor device according to claim 1, further comprising:

a fifth semiconductor region of the first conductivity type provided below the first semiconductor region,
wherein a carrier concentration of the first conductivity type in the fifth semiconductor region is higher than a carrier concentration of the first conductivity type in the first semiconductor region.

12. A method of manufacturing a semiconductor device comprising:
forming a first semiconductor region of a first conductivity type on a first electrode;
forming a second semiconductor region of a second conductivity type on the first semiconductor region;
forming a third semiconductor region of the first conductivity type on the second semiconductor region;
forming a gate electrode, the gate electrode including:
a first portion including polycrystalline silicon and arranged with the second semiconductor region in a second direction perpendicular to a first direction extending from the first electrode to the first semiconductor region and
a second portion including metal and provided on a part of the first portion;
forming a gate insulating layer between the gate electrode and each of the first semiconductor region, the second semiconductor region, and the third semiconductor region, before forming the gate electrode;
forming a first insulating portion on another part of the first portion and the first insulating portion surrounding the second portion;
forming a second insulating portion on the second portion and on the first insulating portion; and
forming a second electrode on the third semiconductor region and on the second insulating portion, and the second electrode is arranged with the second portion in the second direction, wherein
the gate insulating layer extends to the upper surface of the third semiconductor region to form an extending portion, and
the second portion of the gate electrode protrudes upwardly from the upper surface of the extending portion of the gate insulating layer, and a lower part of the second portion of the gate electrode is embedded in the polycrystalline silicon of the first portion of the gate electrode.

13. The method of manufacturing a semiconductor device according to claim 12, wherein the second portion is surrounded by the another part of the first portion outside a groove.

* * * * *